United States Patent [19]

Tucker

[11] Patent Number: 4,516,029

[45] Date of Patent: May 7, 1985

[54] E BEAM STAGE WITH BELOW-STAGE X-Y DRIVE

[75] Inventor: Theodore W. Tucker, Lincoln, Mass.

[73] Assignee: Control Data Corporation, Minneapolis, Minn.

[21] Appl. No.: 489,666

[22] Filed: Apr. 28, 1983

[51] Int. Cl.³ ............................................. H10J 37/20
[52] U.S. Cl. ................................ 250/442.1; 250/440.1
[58] Field of Search .......................... 250/440.1, 442.1; 269/73; 350/531

[56] References Cited

U.S. PATENT DOCUMENTS

| | | | |
|---|---|---|---|
| 2,860,933 | 11/1958 | Wolff | 308/238 |
| 3,155,383 | 11/1964 | Whitmore | 269/58 |
| 3,428,387 | 4/1964 | Hall et al. | 350/86 |
| 3,790,155 | 2/1974 | Longamore | 269/60 |
| 3,881,369 | 5/1975 | Looney | 74/89.2 |
| 4,030,615 | 6/1977 | Guggi et al. | 214/1 BB |
| 4,097,116 | 6/1978 | Kuroha | 350/86 |

Primary Examiner—Alfred E. Smith
Assistant Examiner—Paul A. Guss
Attorney, Agent, or Firm—E. P. Heller, III; J. A. Genovese

[57] ABSTRACT

The invention comprises a high vacuum compatible electron beam stage having an X/Y and theta coordinate positioning drive mechanism mounted from below the stage. The stage comprises four plates: A base plate, an X plate slidably mounted thereon and constrained to slide in an X direction, a Y plate slidably mounted on the X plate and constrained to slide in a Y direction, and a theta plate mounted on the Y plate and constrained to translate in the Z direction. Two rotary capstans, mounted on drive shafts, are coupled on each to the X and Y plates by a metallic band looped around the capstan and attached at opposite ends to the plate. Rotation of the capstan causes the respective plates to slide in their constrained direction. The theta plate drive shaft is limited to vertical motion. The Y and theta drive shafts couple to universal joints. All three drive shafts couple to bellows joints. This permits the drive shafts to deflect at small angles. Each of the drive shafts couples through a rotary vacuum seal to drive motors mounted on a fixed platform exterior to the electron beam vacuum chamber.

6 Claims, 9 Drawing Figures

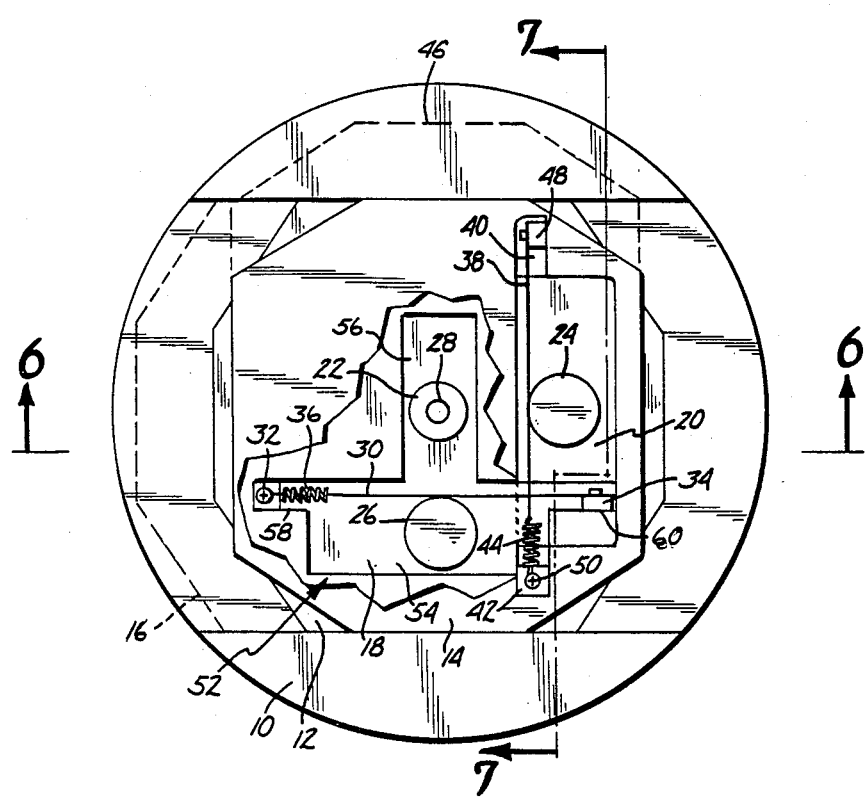

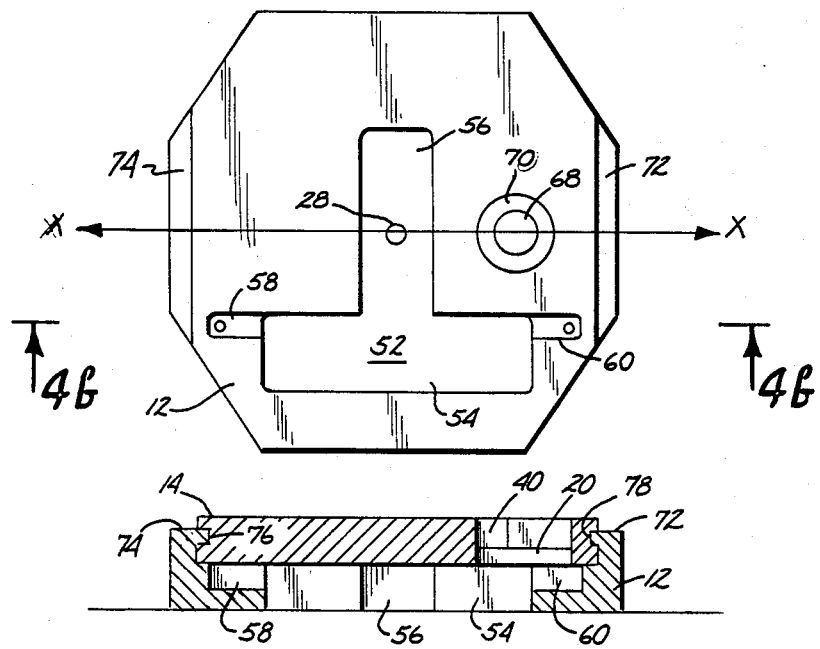
Fig. 4a
Fig. 4b
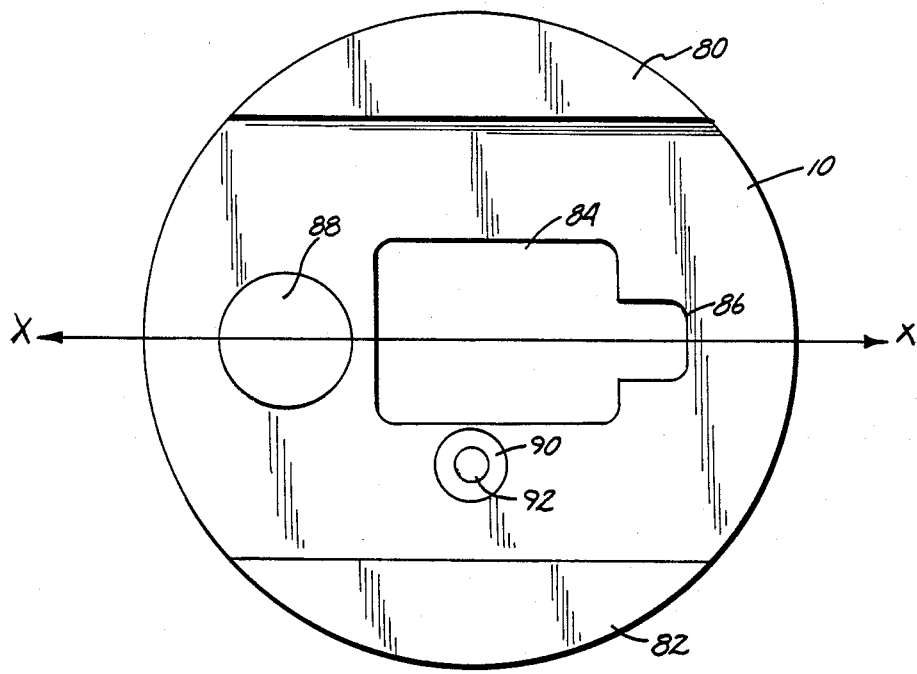
Fig. 5

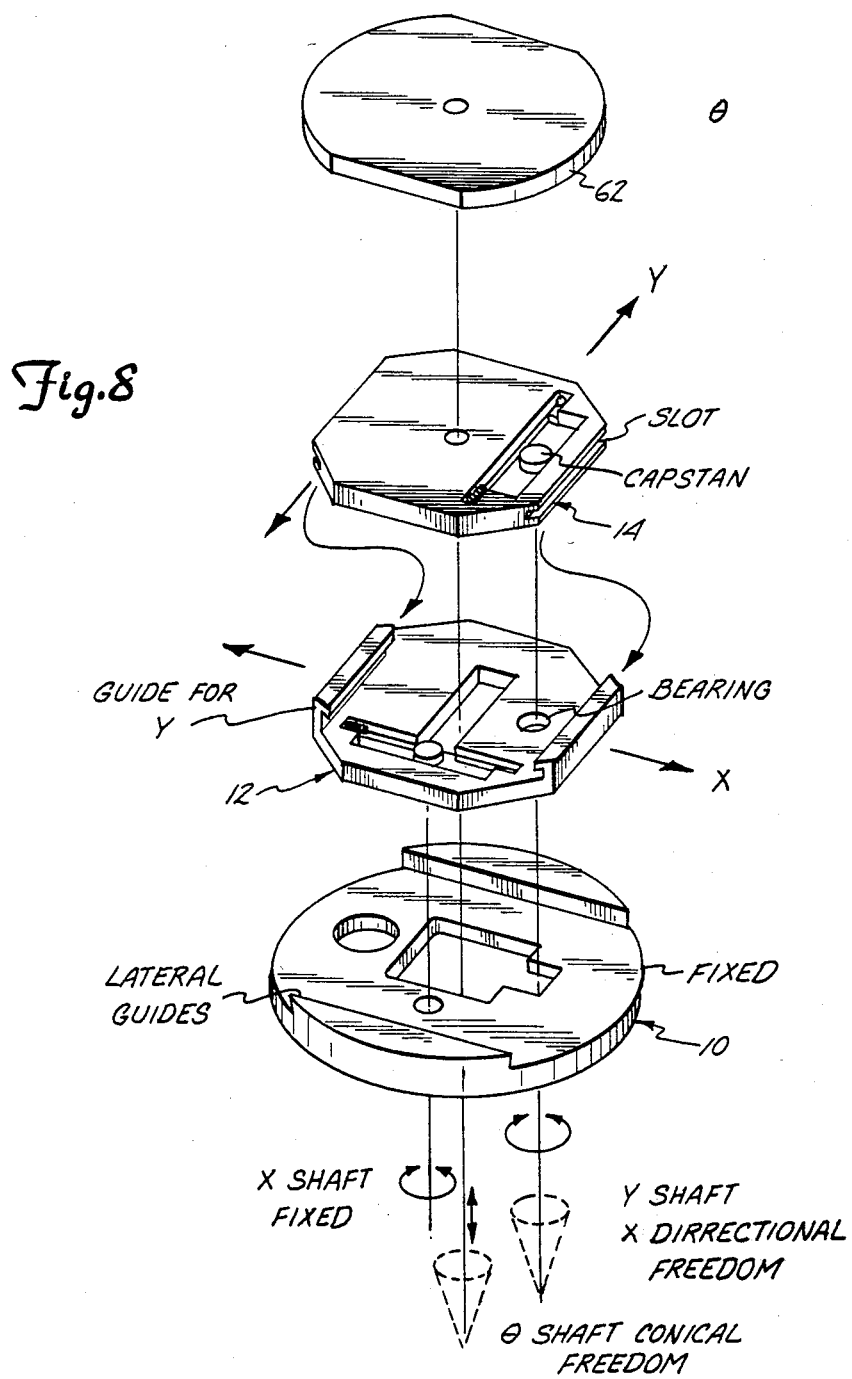

E BEAM STAGE WITH BELOW-STAGE X-Y DRIVE

BACKGROUND OF THE INVENTION

1. Field of the Invention

The invention relates generally to the field of electron beam etching devices, and more particularly to X/Y coordinate positioning mechanisms for the electron beam's stage.

2. Brief Description of the Prior Art

A major problem occurring in drive mechanisms and instrumentation for cross-axis (X/Y) tables or slides is that the "carried" axis usually has to support its own drive mechanism and instrumentation. The drive mechanism and instrumentation is not then mechanically secured to ground and cables have to drag. The slide inertias of the two axes do not match.

In the case of a vacuum contained cross-axis table or stage, the problem is even more serious because the "carried" drive mechanism and instrumentation is mounted in a high vacuum environment. This is usually an intolerable situation due to the lack of materials which can operate with low friction in vacuum environments.

In electron beam processing of integrated circuit chips or masks, high throughput can be achieved if there is a chain of equipment processing the "material" directly through the evacuated chamber. It is not advantageous to have a process mechanism admit raw (unprocessed) "materials" through one port and remove them through the same port. It is desirable that the system allow the processed material to exit on the opposite side of the chamber through another port. This allows loading and unloading to take place in parallel.

Presently, most X/Y stage drives extend, all or in part, through two orthogonal sides of the evacuated chamber. As a result, it is difficult to design apparatus to load the unprocessed material from one side of the chamber and unload it from the other.

Further, present X/Y stages customarily employ ball bearing and race combinations at the interface between stages. However, incorporation of these bearing devices in a high vacuum environment is not desirable because the number of materials that can meet the requirements for bearing purposes and also be high vacuum compatible and magnetically unsusceptible for electron beam purposes are very small and expensive.

SUMMARY OF THE INVENTION

The present invention provides four stacked stage plates, three having flat contacting sufaces impregnated with a solid lubricant to allow sliding motion therebetween. Drive mechanisms couple to the plates from below and are connected to motors mounted on the exterior of the vacuum chamber. The location of the drive mechanisms permits unprocessed material to be loaded from one side of the stage and unloaded from the other side The four plates are mounted in the evacuated electron beam vacuum chamber. They comprise a fixed base plate; an X plate slidably mounted on the base plate and constrained to slide in the X direction; a Y plated slidably mounted on the X-plate and constrained to slide in the Y direction and a theta plate mounted on the Y-plate and constrained to move in a Z-direction relative to the Y plate.

Three drive shafts are coupled to the respective X, Y and theta plates. The first drive shaft is coupled through a fixed bearing mounted in the base plate to a rotary capstan mounted in a lateral aperture in the X plate. Mounted on the rotary capstan is a metallic band looped around the capstan and having ends fixed at opposite ends of the aperture. Rotation of the capstan causes the band to slide the X stage in the X direction.

The Y shaft couples through an aperture in the base plate through a fixed bearing in the X plate to a second rotary capstan mounted in a second lateral aperture in the Y plate. A similar band is looped the second capstan and attached to opposite ends of the second lateral aperture. Rotation of the Y capstan causes the Y stage to slide in the Y direction.

The theta drive shaft is coupled through apertures in the base plate and the X plate and through a fixed bearing in the Y plate to a fixed mounting on the theta plate. Motion of this drive shaft is limited to the vertical.

The X drive shaft is directly coupled through the bearing mounted in the base plate to a bellows coupling, and from there through a rotary vacuum seal to an X drive motor. The Y drive shaft is coupled through the bearing mounted in the X plate to a universal joint and from there to a second bellows coupling, and from there through a second rotary vacuum seal in the vacuum chamber wall, and from there to a Y drive motor. The theta plate is similarly coupled through the bearing mounted in the Y plate, to a universal joint, to a third bellows coupling, to a third rotary vacuum seal, and to a third motor comprising a pivoted liftfork mechanism coupled to a hydraulic mechanism for imparting vertical motion.

BRIEF DESCRIPTION OF THE DRAWINGS

FIG. 1 shows a top plan view of the nested plates, excluding the theta plate;

FIG. 2 shows a bottom plan view of the theta plate.

FIG. 3 shows a top plan view of the Y plate;

FIG. 4A shows a top plan view of the X plate;

FIG. 4B shows a cross-sectional view along B—B of FIG. 4A.;

FIG. 5 shows a top plan view of the base plate of the present invention;

FIG. 8 shows an exploded perspective view of the base, X, Y and theta plates.

DESCRIPTION OF PREFERRED EMBODIMENT

Figure 6:
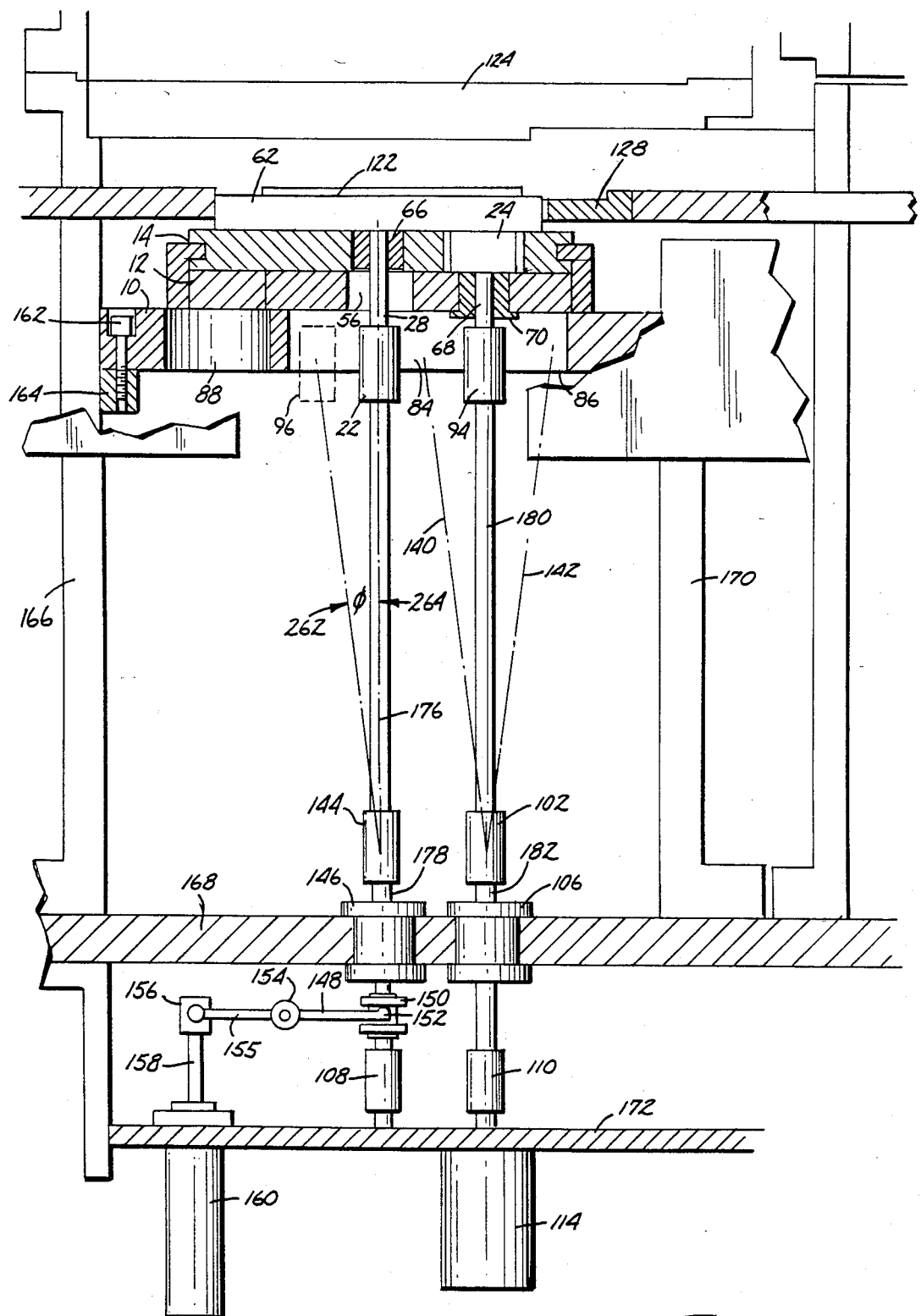
FIG. 6 shows a cross sectional view along 6—6 of FIG. 1 showing the Y drive and the theta drive of the present invention.

FIG. 1 shows a partially cut-away top plan view of the bottom three of the nested plates of the present invention. In particular, shown in the figure are base plate 10, X plate 12 mounted thereon, and Y plate 14 mounted on X plate 12. The mating surfaces of these three plates, 10, 12 and 14, are flat and are impregnated with a solid lubricant such as Teflon available from the Michiana Impreglon Center, Dowagiac, Mich. The solid lubricant permits the three plates to slide freely with respect to each other in a high vacuum environment. Additionally, the top face of the Y plate 14 and the bottom of the theta plate, not shown in FIG. 1, but shown in FIG. 2, are impregnated with a solid lubricant and are free to slide with respect to each other.

The X plate is constrained to move left to right in the figure (X direction). The limits of motion of the X plate 12 to the left in the figure is represented by dotted line 16. The X plate may move a similar distance to the right in the figure.

The Y plate is constrained to move in the vertical direction in the figure (Y direction). The length of travel in the vertical direction is denoted by dotted line 46 The plate 14 may move a similar distance downward in the figure.

Mounted in Y plate is Y aligned lateral aperture 20, having two wing slots 40 and 42. Mounted in aperture 20 and connected to a Y drive shaft discussed infra, is capstan 24. Looped about capstan 24 is metallic band 38 which is connected at its opposite ends 48, 50 to Y plate 14. The connections are made to the plate 14 in the wing slots 40 and 42. The metallic band 30 is maintained under tension by spring 44.

The center of the Y plate 14 has been cut away to expose a T-shaped slot 52 having an X aligned lateral aperture 54 and a Y aligned central aperture 56. Mounted in X aligned lateral aperture is X capstan 26, which is mounted on an X drive shaft, discussed infra. Looped around the capstan 26 is a metallic band 30, which is connected at each of its ends 32 and 34 to X plate 12. The connections are made in lateral wing slots 58, 60 of X aligned lateral aperture 54. The band 30 is maintained under tension by spring 36.

Shown in the Y aligned central aperture 56 is theta drive shaft 28 and universal joint 22 connected thereto. See FIG. 6. These will be discussed in more detail infra; however the theta drive shaft fixedly couples to theta plate 62 shown in FIG. 2

FIG. 2 shows a bottom plan view of the theta plate. Theta drive shaft 28 couples to shaft 64 mounted in theta plate 62. The theta plate is essentially circular in shape having flattened upper and lower edges.

FIG. 3 shows a top plan view of the Y plate. The Y plate's shape is essentially that of an elongated hexagon. Shown in the figure are the Y aligned lateral aperture 20 and lateral wing slots 40 and 42. The figure also shows capstan 24, metallic band 38 connected at its opposite ends 48 and 50 to Y plate 14. Spring 44 maintains the metallic band 38 under tension. A bearing 66 is mounted in the Y plate. Theta drive shaft 28 is slidably mounted in this bearing 66. The freedom of movement of the Y plate 14 is limited to the Y direction as indicated by arrows Y—Y in the figure.

FIG. 4A shows a top plan view of the X plate 12. Mounted in the plate is Y shaft bearing 70. Y drive shaft 68 is rotatably mounted in this bearing 70. The bearing 70 forces Y drive shaft 68 to move with the X plate 12. Also shown in this figure are T-shaped aperture 52 discussed supra. The X capstan 26 (FIG. 1) when rotated, causes the X plate to slide in the X direction, as shown by the arrows X—X in the figure.

FIG. 4B is a section along B—B of FIG. 4A. Shown in the figure are cross sections of X plate 12 and Y plate 14. Y plate 14 is slidably mounted on top of X plate 12 and constrained to move in the Y direction by lateral guides 72 and 74. These guides 72, 74 contain additional coupling members which protrude into slots 76 and 78 mounted on the sides of Y plate 14. These additionally restrain the motion of the Y plate in the vertical direction.

Also shown in FIG. 4B are the cross sections of Y aligned lateral aperture 20 and wing slot 40 mounted in Y plate 14.

The cross section of the X plate shows aligned lateral aperture 54, Y aligned central aperture 56 and wing slots 58 and 60.

FIG. 5 shows a top plan view of the base plate 10. The base plate 10 includes lateral guides 80 and 82 between which the X plate 12 is mounted and by which the X plate 12 is constrained to slide in the X direction (X—X in the figure). The base plate also includes a X-Y aligned central aperture 84, which provides for movement of both the theta drive shaft 28 and the Y drive shaft 68. The theta drive shaft 28 is allowed to move in both the X and Y directions. X-Y aligned central aperture 84 is extended a small distance 86 to the right to allow for movement of the Y drive shaft in this direction.

Mounted in base plate 10 are X drive shaft bearing 90. Mounted therein is X drive shaft 92. The bearing 90 allows rotational motion of shaft 92 but fixes the freedom of motion of drive shaft 92 in the X/Y plane as base plate 10 is fixedly mounted. See FIG. 6.

Also shown in the figure is lightening hole 88.

FIG. 6 is a section along 6—6 of FIG. 1. Base plate 10 is fixedly mounted to vacuum chamber wall 166 by bolts 162 coupling the base plate 10 to a beam member 164 which is in turn fixedly attached to the chamber wall 166. While there is only one such bolt 162 shown in the figure, three others not shown attach the plate 10 to chamber walls 166 and 170 at the other three corners of base plate 10.

X plate 12 is slidably mounted on base plate 10 and Y plate 14 is slidably mounted on X plate 12. Theta plate 62 is mounted on Y plate 14. Also shown in the figures is a wafer 122 mounted atop theta plate 62. Immediately above the wafer is an electron beam device 124. Shown to the right in the figure is a portion of a shuttle 128 which will be discussed in reference to FIG. 7.

Theta drive shaft 28 is mounted in bearing 66 and is fixedly coupled to theta plate 62. The bearing 66 forces theta plate 62 to move with Y plate 14. As Y plate 14 moves in both the X and Y directions, theta plate 62 is similarly constrained to move in both the X and Y directions.

Theta drive shaft 28 couples to a universal joint 22, which in turn couples to the lower portion 176 of the drive shaft 28. The lower portion 176 couples to a bellows coupling 144. A connecting shaft 178 couples to the bellows 144 and is mounted in ferro-fluidic seal mounted in chamber bottom plate 168. Ferro-fludic seal 146 is of a type EMB-188-L-N-130 available from Ferrofluidics Corporation located in Nashua, N.H. This seal prevents the escape of vacuum through the seal while permitting either up and down or rotational motion of a drive shaft coupled there-through. The connecting shaft 178 couples through a lower bellows 108 into a motor mounting plate 172.

Bracket 150 is fixedly mounted on connecting shaft 178 below bottom plate 168. Pivotally coupled to bracket 150 is a liftfork 148 at pivot 152. Liftfork 148 is in turn connected to a pivot 154, which is pivotally mounted to the motor mounting plate by a mounting not shown. Lever arm 155 is connected to pivot 154 and is also pivotally connected to shaft 158 at pivot 156. Shaft 158 is slidably mounted in air cylinder hydraulic drive motor 160. When motor 160 forces shaft 158 downward in the figure, lever arm 155 pivots liftfork 148 upwards driving drive shaft 28 upward.

Y drive shaft 68 is rotatably mounted in bearing 70. This shaft 66 couples to a universal joint 94, which is coupled to a lower Y drive shaft 180. Lower shaft 180 couples to a bellows coupling 102. A second connecting shaft 182 is mounted in a second ferro-fluidic seal 106 mounted in bottom plate 168 and is coupled to bellows coupling 102. Ferro-fluidic seal 106 has the same function as seal 104 discussed above. The shaft is then coupled to a lower bellows coupling 110 to a Y drive motor 114 fixedly mounted on motor mounting plate 172. The Y drive motor causes the Y drive shaft 68 to rotate in a clockwise or a counter clockwise direction. This rotation, in turn, causes the Y capstan 24 to rotate in a similar clockwise or counter clockwise direction, thereby causing the metallic band coupled thereto to move the Y plate 14 in the Y direction as shown in FIGS. 1 and 3.

Also shown in the figure are lightening hole 88, X-Y aligned central aperture 84 with extension 86 and Y aligned central aperture 56.

The extent of the motion of the theta and Y shafts in the X direction are illustrated by lines 262, 264 and 140, 142 respectively. Shown at 96 in dashed line is the leftward-most extension universal joint 22.

The length of lower shafts 176 and 180 is chosen such that the deflecting angle at maximum is approximately 7°. This causes little distortion of the bellows coupling on deflection.

Figure 7:
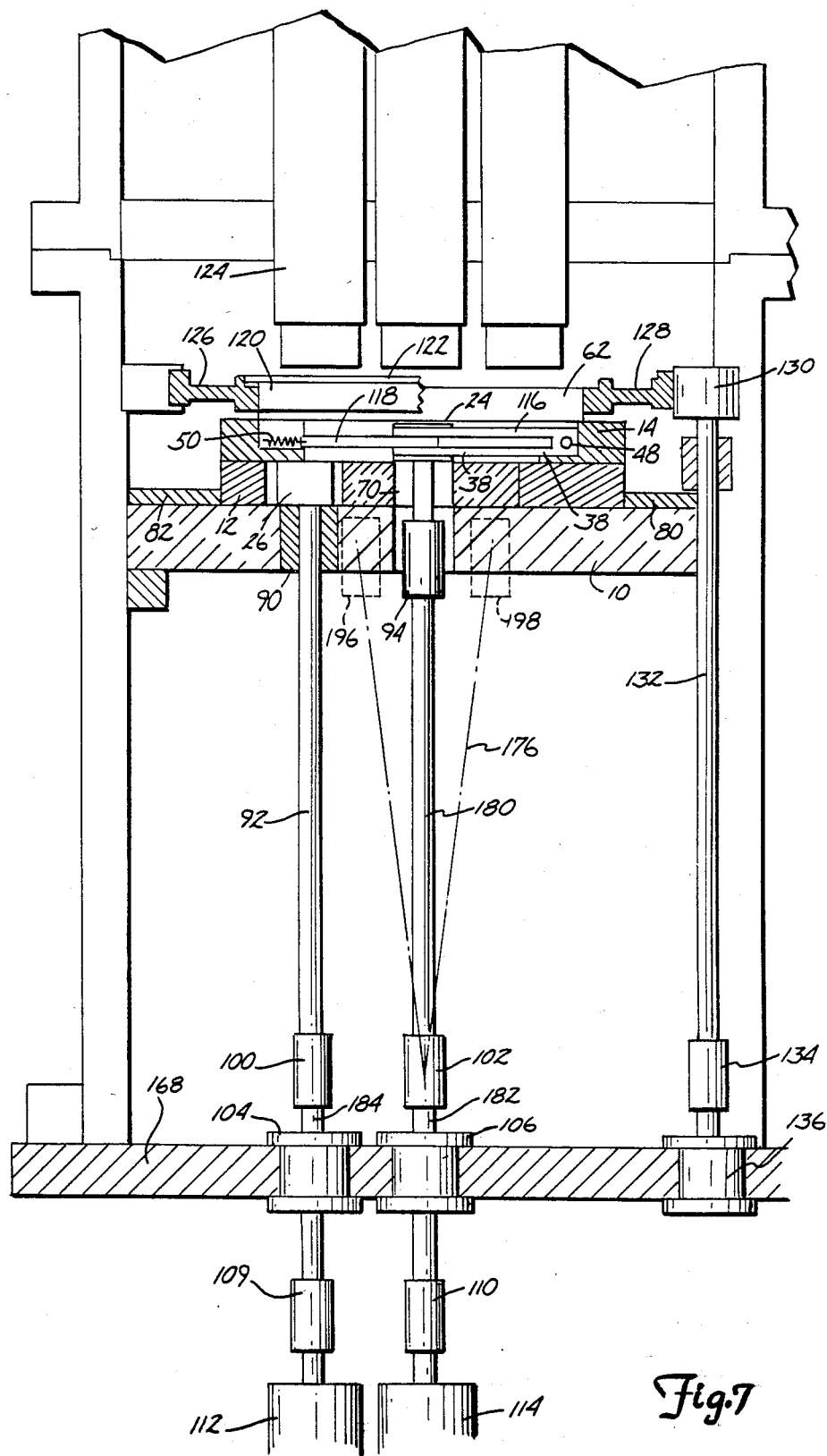
FIG. 7 shows a cross-sectional view along 7—7 of FIG. 1 showing the X drive and the Y drive of the present invention.

FIG. 7 is a section along 7-7 of FIG. 1. Three electron beam devices 124 are mounted above the nested plates 10, 12, 14 and 62 A wafer shuttle comprising a left shuttle track 126, a right shuttle track 128, a shuttle capstan 130, a shuttle drive shaft 132, a shuttle bellows coupling 134, and a shuttle ferro-fluidic seal 136 is mounted below the electron beam devices 124 and above the nested plates 10, 12, 14 and 62. Not shown is a shuttle motor. The figure also shows two positions for theta plate 62. To the left in the figure, theta plate 62 is shown in a "up" position. In this position, wafer 122 clears the shuttle 126 This allows the shuttle to be moved relative to the wafer such as to be withdrawn from under the wafer to retrieve, for example, a second wafer for subsequent loading of the second wafer onto the theta plate 60. To the right in the figure, theta plate 62 is in the "lowered" position In this position, the wafer 122 rests on the right shuttle 128. The shuttle 128 "carries" the wafer 122 for loading and unloading purposes.

Metallic band 38 loop mounts on Y capstan 24. Band 38 comprises two substantially equal portions, a portion 116 having spaced upper and lower bands and a portion 118 having a central band arranged between the spaced upper and lower bands 116. This mounting and arrangement permits the metallic "band" to be wound or unwound on the capstan without interference between the leftmost portion 118 and rightmost portion 116.

Also shown are the band connections 50 and 48 to the Y plate 14. In particular, the rightmost connection 50 is a fixed coupling to Y plate 14, while the leftmost coupling 44 is a spring mounted coupling to Y plate 14. The spring 44 maintains metallic band 38 under tension.

The X band 30 (FIG. 1) is identical to Y band 38.

The Y drive shaft 68 is rotably mounted in bearing 70 and couples to a universal joint 94. A lower Y drive shaft 180 is coupled to joint 94 and a third bellows coupling 102, as discussed above.

Shown in phantom line 196, 198 are the maximum extensions of the theta drive 28 in the Y direction. Lower theta drive shaft 176 is mounted directly behind the lower Y drive shaft 180 in the figure.

X capstan 26 is mounted on X drive shaft 92. Shaft 92 is rotatably mounted in bearing 90. The X drive shaft 92 in contrast to the other two drive shafts, 28 and 68, contains no universal joints because of its fixed mounting in the fixed plate 10. However, it, too, couples to a bellows coupling 100. A connecting shaft 184 is mounted in a third ferro-fluidic seal 104 and is coupled to bellows 100 and 109. This is in turn coupled to X drive motor 112, which is fixedly mounted on motor mounting plate 172.

Ferro-fluidic seals 104, 106, 136 and 146 are mounted in bottom plate 168.

Lateral guides 80 and 82 are mounted on base plate 10 and constrain motion of the X plate 12 to the X direction.

The operation of the nested plates and drives is briefly described as follows: When the X drive motor rotates X drive shaft 92 in a clockwise or counterclockwise direction, X capstan 26, fixed in the X-Y plane by its drive shaft's mounting in bearing 90, drives the X plate back and forth in the X direction.

Similarly, when the Y drive motor rotates the Y drive shaft 68 in the clockwise or counterclockwise direction, the Y capstan 24, fixed relative to the X plate by its drive shaft's mounting in bearing 70 and thus restained to move with the X plate only in the X direction, drives the Y plate in the Y direction.

The theta plate 62 is constrained to move with the Y plate in the X-Y plane by virtue of theta shaft 28 mounting in bearing 66. The theta drive shaft 28 has a freedom of movement in the vertical or Z direction relative to the X/Y plane. The pivoting of liftfork 148 by motor 160 drives the theta plate 62 in the Z direction.

Bellows couplings 102 and 104 permit the lower theta and lower Y drive shafts 176 and 180 to deflect at a small angle while permitting, in the case of the Y drive shaft 180, the Y drive motor 114 to rotate the shaft 180 in a clockwise or a counterclockwise direction. Universal joints 22 and 94 in turn permit the upper portions of the drive shafts 28 and 68 to remain vertically aligned.

FIG. 8 shows an exploded perspective view of the base X, Y and theta plates.

The specification of the elements of the preferred embodiment should not be taken as a limitation on the scope of the appended claims, in which I claim:

1. An electron beam X-Y coordinate positioning stage with below stage drive, comprising:
a base plate fixedly mounted and having a first central aperture and a pair of lateral guides;
an X plate slidably mounted on said base plate between said guides and constrained thereby to move in an X direction; said X plate having a first lateral aperture aligned in the X direction and a second central aperture aligned in the Y direction; said first lateral and said second central apertures intersecting at right angles;
said first lateral aperture having a pair of X wing slots mounted in said X plate at opposite ends of the aperture; said X plate having a second pair of lateral guides;
a Y plate slidably mounted on said X plate between said second guides and constrained thereby to move in an Y direction; said Y plate having a second lateral aperture aligned in the Y direction and having a pair of Y wing slots mounted in said Y plate at opposite ends of the aperture;
a theta plate mounted on said Y plate;
an X bearing mounted in said base plate;

a Y bearing mounted in said X plate;

a theta bearing mounted in said Y plate;

a theta drive shaft slidably mounted in said theta bearing and fixedly coupled to said theta plate from below;

a Y drive shaft rotably mounted in said Y bearing;

a Y capstan fixedly mounted on said Y drive shaft in said second lateral aperture;

an X drive shaft rotably mounted in said X bearing;

an X capstan fixedly mounted on said X drive shaft in said first lateral aperture;

a Y band means looped mounted on said Y capstan and attached at its opposed ends to the Y plate in said Y wing slots; an X band means looped mounted on said X capstan and attached at its opposite ends to the X plate in said X wing slots;

a theta universal joint coupled to said theta drive shaft;

a lower theta drive shaft coupled to said theta universal joint;

a Y universal joint coupled to said Y drive shaft;

a lower Y drive shaft coupled to said Y universal joint;

a bellows coupling mounted on said lower Y drive shaft;

an electron beam chamber bottom plate;

an X seal bearing means mounted in said bottom plate;

a Y seal bearing means mounted in said bottom plate;

a theta bearing means mounted in said bottom plate;

said X drive shaft rotably mounted in said X seal bearing means;

a Y connecting drive shaft rotably mounted in said Y seal bearing means and coupled to said bellows coupling;

said lower theta drive shaft rotably mounted in said theta seal bearing means;

means for driving said lower theta shaft in the vertical (Z) direction fixedly mounted below said bottom plate and coupled to said lower theta shaft;

means for rotating said X drive shaft fixedly mounted below said bottom plate and coupled to said X drive shaft; and means for rotating said Y connecting drive shaft fixedly mounted below said bottom plate and coupled to said Y connecting plate.

2. The electron beam X-Y coordinate positioning stage with below stage drive of claim one further including:

a bellows coupling mounted on said theta drive shaft; and a lower theta connecting drive shaft mounted in said theta seal bearing means and coupled to said bellows coupling and said means for driving said lower theta shaft in the vertical (z) direction.

3. The electron beam X-Y coordinate positioning stage with below stage drive of claim one further including:

a bellows coupling mounted on said X drive shaft; and a lower X connecting drive shaft rotably mounted in said X seal bearing means and coupled to said bellows coupling and said means for rotating said X drive shaft.

4. The electron beam X-Y coordinate positioning stage with below stage drive of claim one wherein said X and Y band means comprise metallic bands having two substantially equal portions, a first portion having upper and lower band members spaced from each other, and a second portion having a single member aligned to fit in the space between said upper and lower band members.

5. The electron beam X-Y coordinate positioning stage with below stage drive of claim one further including:

two springs, one each mounted between the respective X and Y plates and each of said X and Y band means at at least one end of the band means to maintain said band means under tension.

6. The electron beam X-Y coordinate positioning stage with below stage drive of claim one further including:

a solid lubricant impregnated on the facing surfaces of the base, X and Y plates.

* * * * *